United States Patent

Ganzhorn et al.

(10) Patent No.: US 8,799,850 B2
(45) Date of Patent: Aug. 5, 2014

(54) SIMULATION-BASED DESIGN STATE SNAPSHOTTING IN ELECTRONIC DESIGN AUTOMATION

(75) Inventors: Salem L. Ganzhorn, Apex, NC (US);
Kristin M. Beggs, Oviedo, FL (US);
Govindaswamy Chithamudali, San Jose, CA (US)

(73) Assignee: Synopsys, Inc., Mountain View, CA (US)

( * ) Notice: Subject to any disclaimer, the term of this patent is extended or adjusted under 35 U.S.C. 154(b) by 683 days.

(21) Appl. No.: 12/608,645

(22) Filed: Oct. 29, 2009

(65) Prior Publication Data

US 2011/0107293 A1     May 5, 2011

(51) Int. Cl.
*G06F 17/50*     (2006.01)
(52) U.S. Cl.
USPC ........... 716/139; 716/102; 716/103; 716/104; 716/106; 716/110; 716/111; 716/136; 703/13; 703/14; 703/16
(58) Field of Classification Search
USPC ......... 716/102, 103, 104, 106, 110, 111, 136, 716/139; 703/13, 14, 16
See application file for complete search history.

(56) References Cited

U.S. PATENT DOCUMENTS

| | | | | |
|---|---|---|---|---|
| 5,809,283 | A * | 9/1998 | Vaidyanathan et al. | 703/16 |
| 5,812,414 | A * | 9/1998 | Butts et al. | 716/103 |
| 6,094,654 | A * | 7/2000 | Van Huben et al. | 1/1 |
| 6,470,482 | B1 * | 10/2002 | Rostoker et al. | 716/102 |
| 6,651,225 | B1 * | 11/2003 | Lin et al. | 716/113 |
| 6,665,854 | B2 * | 12/2003 | Fujiwara et al. | 716/112 |
| 6,785,873 | B1 * | 8/2004 | Tseng | 716/102 |
| 6,810,442 | B1 * | 10/2004 | Lin et al. | 710/22 |
| 6,834,380 | B2 * | 12/2004 | Khazei | 716/115 |
| 6,885,983 | B1 * | 4/2005 | Ho et al. | 703/14 |
| 6,968,517 | B2 * | 11/2005 | McConaghy | 716/102 |
| 7,103,434 | B2 * | 9/2006 | Chernyak et al. | 700/98 |
| 7,437,692 | B2 * | 10/2008 | Oberlaender | 716/138 |
| 7,478,028 | B2 * | 1/2009 | Ho et al. | 703/14 |
| 7,480,606 | B2 * | 1/2009 | Tseng et al. | 703/14 |
| 7,580,037 | B1 * | 8/2009 | Iotov | 345/440 |
| 7,818,157 | B2 * | 10/2010 | Schultz | 703/14 |
| 7,827,017 | B2 * | 11/2010 | Kundert | 703/14 |
| 7,827,510 | B1 * | 11/2010 | Schubert et al. | 716/136 |
| 7,882,458 | B2 * | 2/2011 | Tamaki et al. | 716/132 |

(Continued)

OTHER PUBLICATIONS

Shim et al.; "A fast two-pass HDL simulation with on-demand dump"; Publication Year: 2008; Design Automation Conference, 2008. ASPDAC 2008. Asia and South Pacific; pp. 422-427.*
Owczarek et al.; "Design of graphical user interface (GUI) for analog EDA tool"; Publication Year: 2004; Modern Problems of Radio Engineering, Telecommunications and Computer Science, 2004. Proceedings of the International Conference pp. 560-562.*

(Continued)

*Primary Examiner* — Helen Rossoshek
(74) *Attorney, Agent, or Firm* — Park, Vaughan, Fleming & Dowler LLP; Chia-Hsin Suen

(57) ABSTRACT

Some embodiments provide a system that performs a simulation within an electronic design automation (EDA) application. During operation, the system obtains a design from a user of the EDA application. Next, the system performs the simulation using the design to create a set of current simulation results associated with the design. The system then automatically saves a current design state of the design which is associated with the current simulation results. Finally, the system enables subsequent access to the current design state and one or more previous design states of the design by the user through a graphical user interface (GUI) associated with the EDA application.

22 Claims, 5 Drawing Sheets

(56) References Cited

U.S. PATENT DOCUMENTS

| | | | |
|---|---|---|---|
| 7,904,871 B2* | 3/2011 | Raymond et al. | 716/132 |
| 7,970,596 B2* | 6/2011 | Bade et al. | 703/13 |
| 8,020,123 B2* | 9/2011 | Wilson | 716/106 |
| 8,146,030 B2* | 3/2012 | Burnette et al. | 716/104 |
| 8,195,446 B2* | 6/2012 | Durand et al. | 703/28 |
| 8,332,789 B2* | 12/2012 | Perry et al. | 716/106 |
| 8,578,322 B2* | 11/2013 | Bhushan et al. | 716/139 |
| 2011/0172792 A1* | 7/2011 | Shinohara et al. | 700/90 |
| 2013/0282626 A1* | 10/2013 | White et al. | 706/11 |

OTHER PUBLICATIONS

Yue-li Hu et al.; "Design of On-Chip Debug Module Based on MCU"; Publication Year: 2007; High Density packaging and Microsystem Integration, 2007. HDP '07. International Symposium on; pp. 1-4.*

Factor et al.; "Rigorous testing using SnapShot"; Publication Year: 1997; Computer Systems and Software Engineering, 1997., Proceedings of the Eighth Israeli Conference on; pp. 12-21.*

* cited by examiner

SIMULATION-BASED DESIGN STATE SNAPSHOTTING IN ELECTRONIC DESIGN AUTOMATION

BACKGROUND

1. Field

The present embodiments relate to electronic design automation (EDA). More specifically, the present embodiments relate to techniques for automatically snapshotting design states of EDA designs upon creating simulation results associated with the design states.

2. Related Art

Integrated circuit design often involves the use of schematics, which typically contain logical representations of components and wires in integrated circuits. EDA tools are typically used for creating schematics. For example, a schematic editor may allow a designer to create an electronic schematic of an integrated circuit. The electronic schematic may then be used by other EDA tools to simulate the operation of the integrated circuit, create a layout of the integrated circuit, and/or detect errors in the schematic.

In particular, EDA tools may verify the correct operation of the integrated circuit by providing simulators for the integrated circuit. For example, an EDA application may provide transistor-level simulation to verify the device-level accuracy of the schematic. The EDA application may also include a logic simulator that verifies the logic-level accuracy of the schematic. Finally, the EDA application may provide behavioral simulation of the schematic's architectural operation to verify the cycle-level and/or interface-level accuracy of the schematic.

Simulations may additionally facilitate the design of the integrated circuit by providing feedback regarding the integrated circuit's operation and/or performance. For example, a transistor-level simulation may be performed using the schematic and a set of design parameters and/or testbench parameters associated with the schematic. Results from the simulation may be used to update the schematic, the design parameters, and/or the testbench parameters, and a subsequent transistor-level simulation may be performed to determine the impact of the update on the integrated circuit's operation and/or performance. The alternating execution of simulations and updating of design parameters and/or testbench parameters may proceed until the desired simulation results are obtained.

Consequently, tighter integration of simulation and design environments within EDA tools may improve the ease and efficiency with which integrated circuits are designed.

SUMMARY

Some embodiments provide a system that performs a simulation within an electronic design automation (EDA) application. During operation, the system obtains a design from a user of the EDA application. Next, the system performs the simulation using the design to create a set of current simulation results associated with the design. The system then automatically saves a current design state of the design which is associated with the current simulation results. Finally, the system enables subsequent access to the current design state and one or more previous design states of the design by the user through a graphical user interface (GUI) associated with the EDA application.

In some embodiments, the system also saves the current simulation results with the current design state.

In some embodiments, the current design state is saved in a hidden directory within a directory containing the current simulation results.

In some embodiments, enabling access to the current design state by the user through the GUI involves at least one of:

(i) displaying a simulation result history associated with the design to the user;
(ii) displaying a graphic associated with changes to a parameter (e.g., a design parameter or a testbench parameter) or an output in the design over time; and
(iii) enabling a search of the simulation result history by the user.

In some embodiments, the simulation result history and the graphic are associated with one or more sets of previous simulation results created using the design.

In some embodiments, the previous simulation results are saved with the one or more previous design states of the design, and the user accesses the previous design states and the current design state by selecting one of the sets of previous simulation results or the current simulation results within the GUI.

In some embodiments, the design corresponds to an analog circuit design.

BRIEF DESCRIPTION OF THE FIGURES

In the figures, like reference numerals refer to the same figure elements.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing code and/or data now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, methods and processes described herein can be included in hardware modules or apparatus. These modules or apparatus may include, but are not limited to, an application-specific integrated circuit (ASIC) chip, a field-programmable gate array (FPGA), a dedicated or shared processor that executes a particular software module or a piece of code at a particular time, and/or other programmable-logic devices now known or later developed. When the hardware modules or apparatus are activated, they perform the methods and processes included within them.

Figure 1:
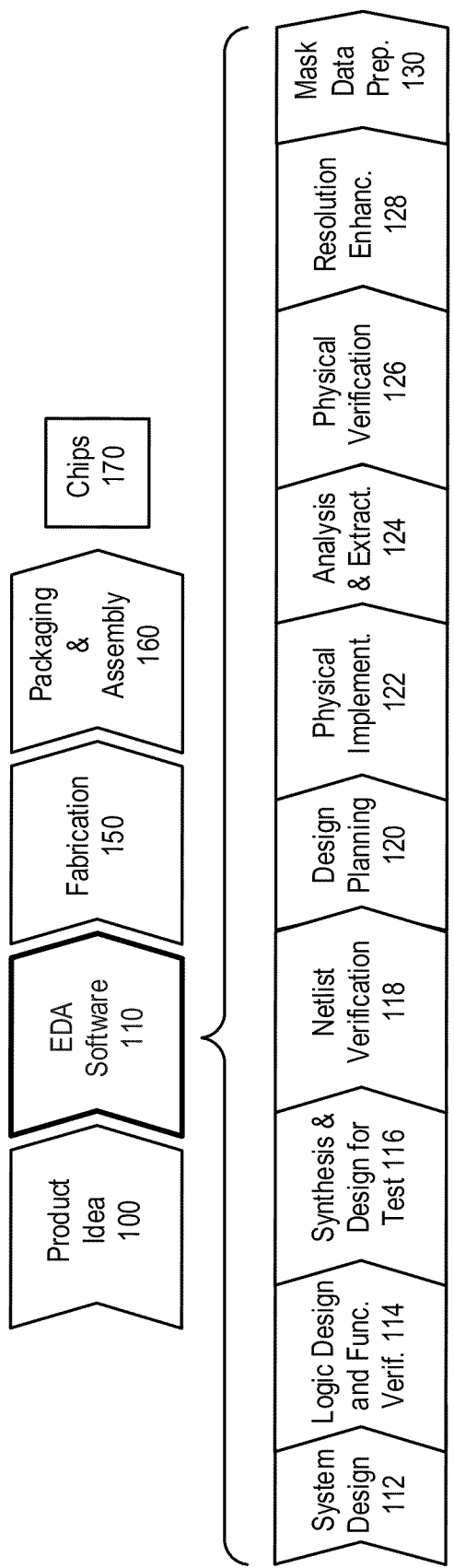
FIG. 1 shows a workflow associated with the design and fabrication of an integrated circuit in accordance with an embodiment of the present invention.

FIG. 1 shows a workflow associated with the design and fabrication of an integrated circuit in accordance with an embodiment of the present invention. The workflow may begin with a product idea (step 100), which may be realized using an integrated circuit that is designed using an electronic design automation (EDA) process (step 110). After the integrated circuit design is finalized, the design may undergo a fabrication process (step 150) and a packaging and assembly process (step 160) to produce chips 170.

The EDA process (step 110) includes steps 112-130, which are described below for illustrative purposes only and are not meant to limit the present invention. Specifically, the steps may be performed in a different sequence than the sequence described below.

During system design (step 112), circuit designers may describe the functionality to be implemented in the integrated circuit. They may also perform what-if planning to refine functionality, check costs, etc. Hardware-software architecture partitioning may also occur at this stage. Exemplary EDA software products from Synopsys, Inc. that may be used at this step include Model Architect, Saber®, System Studio, and DesignWare®.

During logic design and functional verification (step 114), the VHDL or Verilog code for modules in the system may be written and the design may be checked for functional accuracy, (e.g., the design may be checked to ensure that it produces the correct outputs). Exemplary EDA software products from Synopsys, Inc. that may be used at this step include VCS®, Vera®, DesignWare®, Magellan™, Formality®, ESP and Leda® for digital verification and HSPICE®, HSIM®, Nanosim™ for analog verification.

During synthesis and design for test (step 116), the VHDL/Verilog may be translated to a netlist. Further, the netlist may be optimized for the target technology, and tests may be designed and implemented to check the finished chips. Exemplary EDA software products from Synopsys, Inc. that may be used at this step include Design Compiler®, Physical Compiler®, Test Compiler, Power Compiler™, FPGA Compiler, TetraMAX®, and DesignWare®.

During netlist verification (step 118), the netlist may be checked for compliance with timing constraints and for correspondence with the VHDL/Verilog source code. Exemplary EDA software products from Synopsys, Inc. that may be used at this step include Formality®, PrimeTime®, and VCS®.

During design planning (step 120), an overall floorplan for the chip may be constructed and analyzed for timing and top-level routing. Exemplary EDA software products from Synopsys, Inc. that may be used at this step include Astro™ and IC Compiler products.

During physical implementation (step 122), circuit elements may be positioned in the layout (placement) and may be electrically coupled (routing). Exemplary EDA software products from Synopsys, Inc. that may be used at this step include Astro™ and IC Compiler products.

During analysis and extraction (step 124), the circuit's functionality may be verified at a transistor level and parasitics may be extracted. Exemplary EDA software products from Synopsys, Inc. that may be used at this step include AstroRail™, PrimeRail, PrimeTime®, and Star-RCXT™.

During physical verification (step 126), the design may be checked to ensure correctness for manufacturing, electrical issues, lithographic issues, and circuitry. Hercules™ is an exemplary EDA software product from Synopsys, Inc. that may be used at this step.

During resolution enhancement (step 128), geometric manipulations may be performed on the layout to improve manufacturability of the design. Exemplary EDA software products from Synopsys, Inc. that may be used at this step include Proteus/ProGen, ProteusAF, and PSMGen.

During mask data preparation (step 130), the design may be "taped-out" to produce masks that are used during fabrication.

Figure 2:
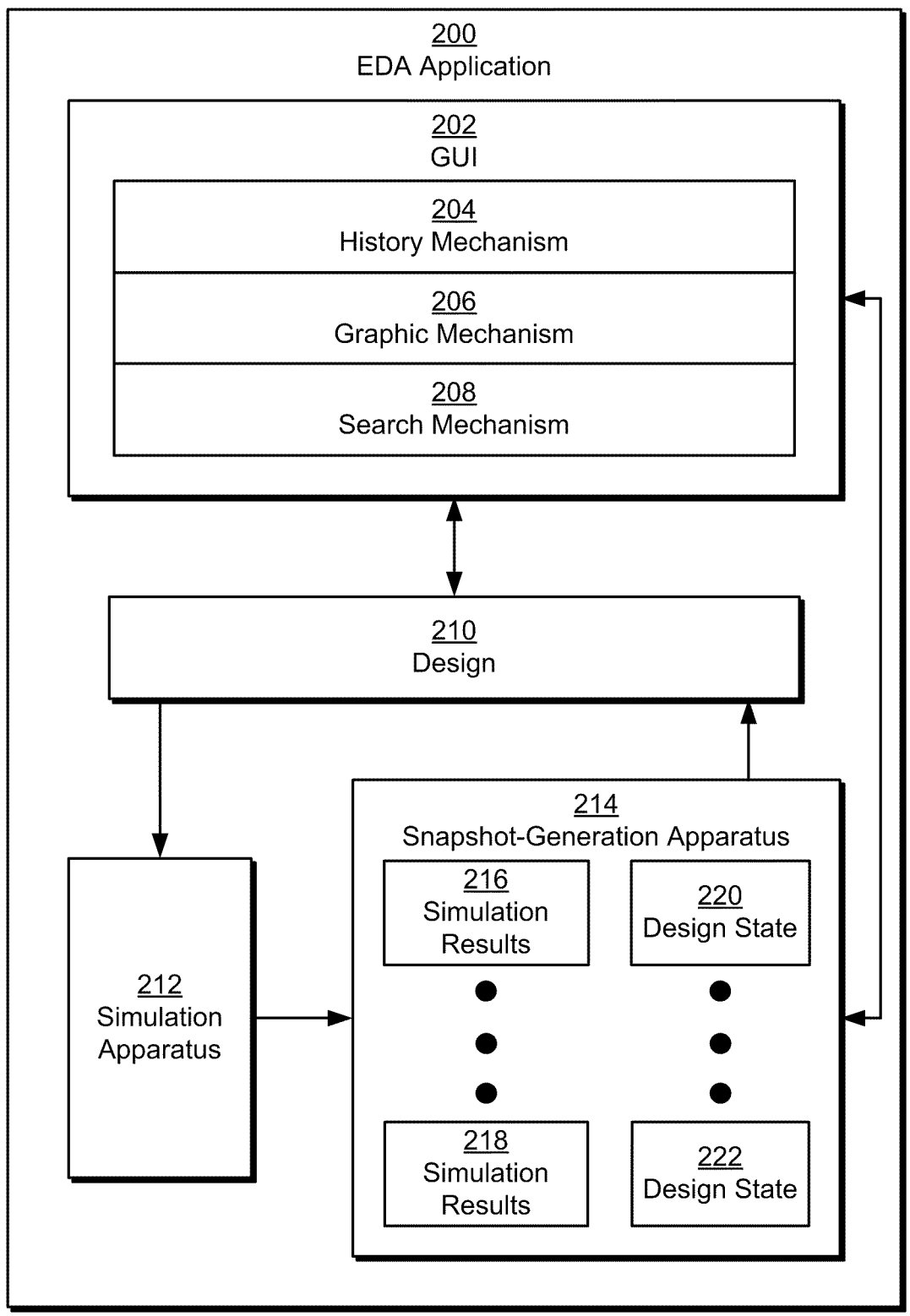
FIG. 2 shows an electronic design automation (EDA) application in accordance with an embodiment of the present invention.

FIG. 2 shows an EDA application 200 in accordance with an embodiment of the present invention. As shown in FIG. 2, EDA application 200 includes a graphical user interface (GUI) 202, a design 210, a simulation apparatus 212, and a snapshot-generation apparatus 214. Each of these components is described in further detail below.

Design 210 may correspond to an abstract representation of an integrated circuit that uses graphical objects to represent components in the integrated circuit. For example, design 210 may correspond to an analog circuit design that may be visually represented using symbols for resistors, capacitors, transistors, logic gates, and/or other components in the integrated circuit. The graphical objects may additionally be connected by lines that represent power and signal connections between the corresponding components. In other words, the functionality of the integrated circuit may be illustrated by the components and interconnections within design 210.

Furthermore, design 210 may be created using EDA application 200. For example, EDA application 200 may correspond to a schematic editor, such as a Custom Designer Schematic Editor from Synopsys, Inc., that allows a user to create a schematic corresponding to design 210 on a computer system. EDA application 200 may also allow the user to simulate and/or verify design 210. In particular, simulation apparatus 212 may allow the user to test the correctness and/or performance of design 210 through transistor simulation, logic simulation, and/or behavioral simulation of design 210. EDA application 200 may also include functionality to allow the user to view simulation results within GUI 202. For example, EDA application 200 may include an HSPICE (HSPICE™ is a registered trademark of Synopsys, Inc.) simulator, CustomSim (CustomSim™ is a registered trademark of Synopsys, Inc.) simulator, Custom Designer Simulation and Analysis Environment, and/or WaveView Analyzer from Synopsys, Inc.

Furthermore, the user may change and/or update design 210 based on simulations of design 210. For example, the user may run a simulation provided by simulation apparatus 212 using design 210 and a set of design parameters and/or testbench parameters associated with design 210. The user may then modify design 210 and/or one or more design or testbench parameters based on a set of simulation results (e.g., simulation results 216-218) created from the simulation. Consequently, the user may create design 210 by alternating between simulating design 210 and modifying design 210 based on simulation results created from the simulations.

However, gradual changes to design 210 by the user may produce simulation results that deviate from rather than approach the user's desired simulation results. For example, the user may attempt to decrease the power consumption of the integrated circuit, but instead may make a series of changes to design 210 that increase the power consumption of the integrated circuit. In addition, the user may be unable to reproduce the conditions that previously created the most optimal simulation results. In other words, changes to design 210 between simulations may preclude the effective design of the integrated circuit.

In one or more embodiments, EDA application 200 allows the user to revert to previous versions of design 210, even if the user saves over the previous versions. The user may thus be able to restore design 210 to a previous configuration that produces better simulation results than the current configuration of design 210. More specifically, snapshot-generation apparatus 214 may automatically save (e.g., create a snapshot of) a design state (e.g., design states 220-222) of design 210 every time a set of simulation results (e.g., simulation results 216-218) is created by simulation apparatus 212. The design state may correspond to the arrangement of components and/or interconnections in design 210, as well as the value of testbench parameters used to produce the simulation results. In some embodiments, the user can associate a name with a saved design state. The name can then be used to refer to the saved design state and the associated simulation results. For example, the user may associate the name "golden" with a saved design state which meets certain design criteria. Next, as the user tries to further improve the performance of a circuit design, the user can use the name "golden" to easily compare the parameters and outputs associated with the most recent circuit design with those of the "golden" design. Note that the user can retroactively name a design state that was automatically saved. For example, the user may realize that a design state that was automatically saved at an earlier point in time provided the best results, and associate a name to this saved design state so that the user can use the name to refer to the saved design state later.

Furthermore, simulation results 216-218 may be saved by snapshot-generation apparatus 214 with design states 220-222 used to produce the simulation results. For example, snapshot-generation apparatus 214 may save design state 220 in a hidden directory within a directory containing simulation results 216. Consequently, snapshot-generation apparatus 214 may allow the user to subsequently access previous design states 220-222 of design 210 through simulation results 216-218 that were created from the design states. In some embodiments, the system can reduce storage requirements by storing the incremental changes from one point in the history to the next, instead of storing the entire design state at each point.

For example, the user may run a series of three simulations on design 210 within EDA application 200 to create three sets of simulation results associated with design 210. Once each set of simulation results is created, snapshot-generation apparatus 214 may save the current design state of design 210 with the simulation results. Snapshot-generation apparatus 214 may also keep the saved design states and simulation results even as new simulation results are generated and/or the user manually saves over design 210 with new versions of design 210. In effect, snapshot-generation apparatus 214 may maintain a simulation result history containing simulation results created from design 210, along with design states of design 210 used to create the simulation results.

In one or more embodiments, GUI 202 includes a set of mechanisms 204-208 that allow the user to access previous design states 220-222 of design 210. As shown in FIG. 2, GUI 202 includes a history mechanism 204, a graphic mechanism 206, and a search mechanism 208. History mechanism 204 may allow the user to view the simulation result history maintained by snapshot-generation apparatus 214. Graphic mechanism 206 may display a graphic (e.g., chart, plot, etc.) associated with changes to a parameter in design 210, simulation results 216-218, and/or design states 220-222 over time. Search mechanism 208 may allow the user to search within the simulation result history for specific names, values, and/or other attributes associated with a design state 220-222 of design 210. History mechanism 204, graphic mechanism 206, and search mechanism 208 are discussed in further detail below with respect to FIG. 3.

EDA application 200 may thus allow the user to access automatically saved design states 220-222 of design 210, even if the user manually saves over the design states. The user may additionally identify design states that produced desirable simulation results 216-218 through displays associated with the simulation results in GUI 202. For example, the user may find design states that produce signals with certain frequencies by viewing a plot of signal frequencies from simulation results of design 210 over time within graphic mechanism 206. Finally, the user may use attributes of previous design states 220-222 and simulation results 216-218 to improve the operation and/or performance of design 210. For example, the user may access previous design states 220-222 saved by snapshot-generation apparatus 214 to find attributes of the previous design states that result in low power consumption. The user may then decrease the power consumption of design 210 by incorporating the attributes into design 210.

Figure 3:
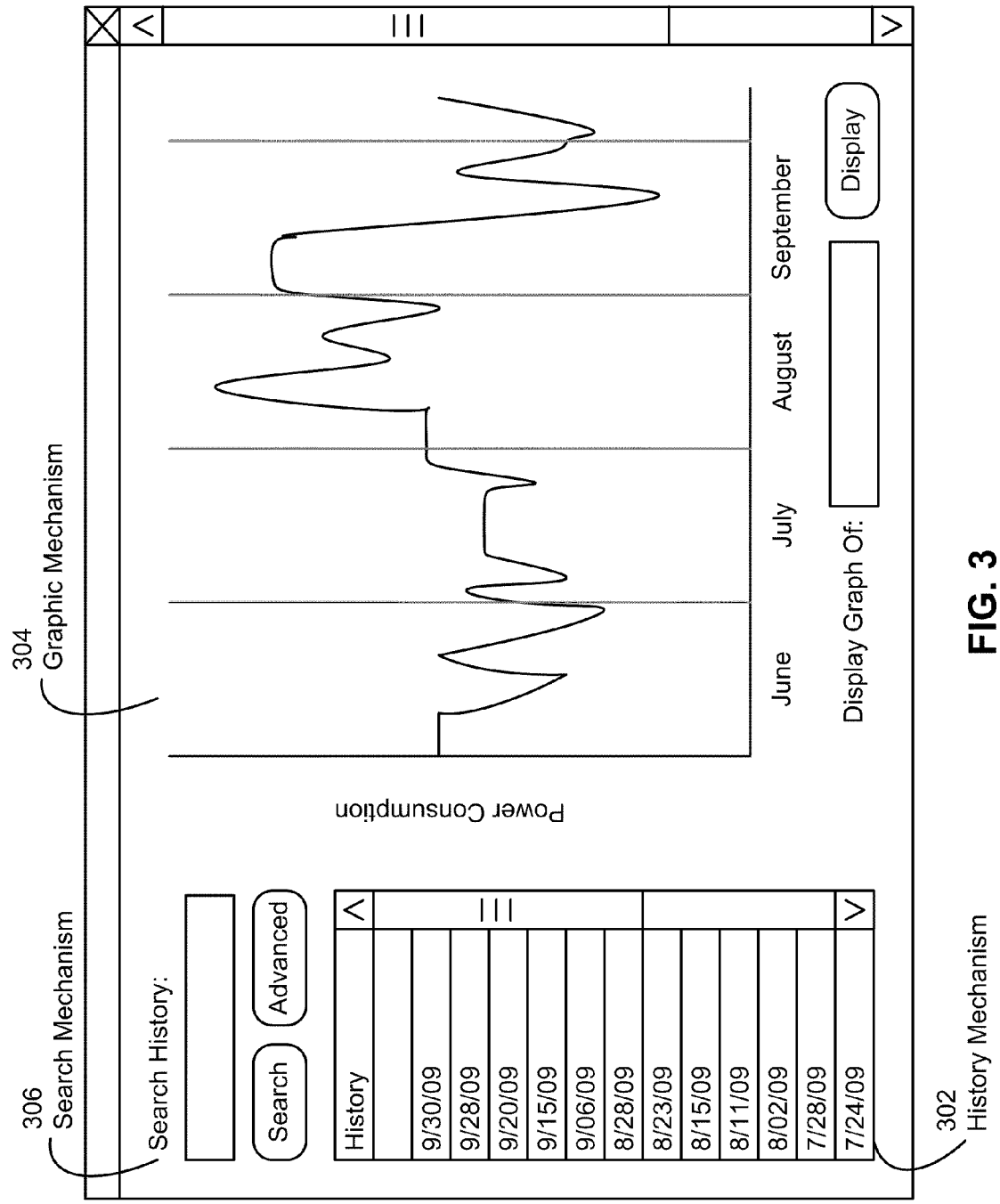
FIG. 3 shows an exemplary screenshot in accordance with an embodiment of the present invention.

FIG. 3 shows an exemplary screenshot in accordance with an embodiment of the present invention. More specifically, FIG. 3 shows a screenshot of a GUI for an EDA application, such as GUI 202 of FIG. 2. The GUI of FIG. 3 may allow a user of the EDA application to access a set of simulation results for a design (e.g., design 210 of FIG. 2) and/or design states of the design that are associated with the simulation results. As described above, design states may be snapshotted after simulation results are created from the design states. In addition, each set of simulation results may be saved with a design state that produced the simulation results.

The GUI of FIG. 3 may allow the user to identify and/or access a specific design state based on simulation results and/or other attributes associated with the design state. As shown in FIG. 3, the GUI includes a history mechanism 302, a graphic mechanism 304, and a search mechanism 306. History mechanism 302 displays a simulation result history associated with the design. The simulation result history may include a list of simulation results created from simulations of the design. Furthermore, each set of simulation results may be identified by the date on which the simulation results were created. For example, history mechanism 302 displays a list of 12 sets of simulation results that were created between Jul. 24, 2009, and Sep. 30, 2009. The user may access each set of simulation results by selecting (e.g., using a cursor, keyboard, etc.) the corresponding date within history mechanism 302. For example, the user may click on the entry labeled "Aug. 11, 2009" to access simulation results created from the design on Aug. 11, 2009. History mechanism 302 may also allow the user to access the design states from which the simulation results were created. For example, history mechanism 302 may generate a dialog box that queries the user for optional access to a design state after the user selects a set of simulation results associated with the design state. Consequently, history mechanism 302 may allow the user to chronologically access simulation results and design states associated with the simulation results.

Graphic mechanism 304 may display a graphic associated with changes to a parameter or an output in the design over time. Within the GUI of FIG. 3, graphic mechanism 304 displays a plot of power consumption over the months of June, July, August, and September for the design. The user may use graphic mechanism 304 to identify simulation results and/or design states that produce desirable values of the parameter (e.g., power consumption). For example, the user may identify design states that produce low power consumption using the plot shown in graphic mechanism 304. As with history mechanism 302, the user may access a specific set of simulation results and/or the corresponding design state by selecting a point in the plot. For example, the user may use a cursor to select the low point in the plot in September and access the simulation results and/or design state associated with the low point. As a result, graphic mechanism 304 may correspond to a visual and/or parameter-based mechanism for accessing simulation results and the associated design states.

Search mechanism 306 may allow the user to search the simulation result history for specific terms, values, and/or ranges. As shown in FIG. 3, search mechanism 306 includes a form field into which search terms may be entered. Such search terms may be associated with parameter names, parameter values, parameter ranges, components, shapes, and/or other attributes of the design. Search mechanism 306 also includes a "Search" button that triggers a search for the search terms entered into the form field. For example, the user may enter a set of search terms into the form field and select the "Search" button. Search mechanism 306 may then return a list of simulation results that match the search terms. Search mechanism 306 may also provide more complex search mechanisms through an "Advanced" button. For example, the user may select the "Advanced" button to access another portion of search mechanism 306 that includes multiple form fields and/or other user interface elements (e.g., checkboxes, radio buttons, etc.) for performing advanced queries of the simulation result history. In other words, search mechanism 306 may provide search-based access to simulation results and/or design states.

Figure 4:
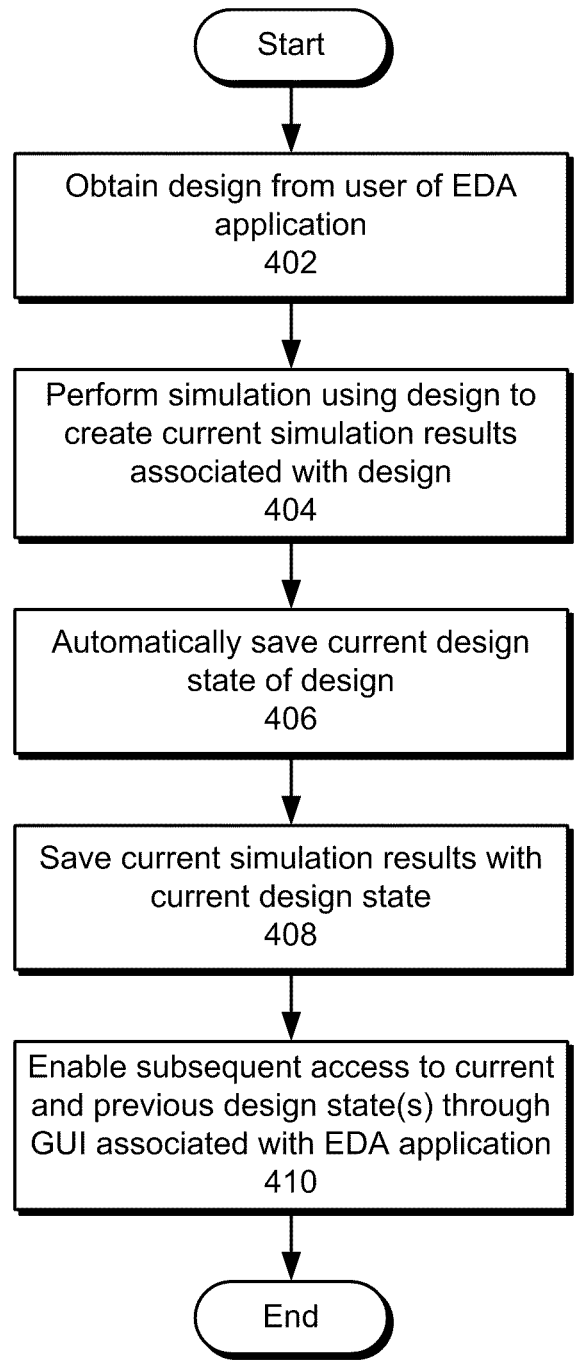
FIG. 4 shows a flowchart illustrating the process of performing a simulation within an EDA application in accordance with an embodiment of the present invention.

FIG. 4 shows a flowchart illustrating the process of performing a simulation within an EDA application in accordance with an embodiment of the present invention. In one or more embodiments, one or more of the steps may be omitted, repeated, and/or performed in a different order. Accordingly, the specific arrangement of steps shown in FIG. 4 should not be construed as limiting the scope of the embodiments.

First, a design is obtained from a user of the EDA application (operation 402). The design may correspond to an abstract representation of an integrated circuit that is being created by the user. For example, the design may correspond to an analog circuit design. Next, a simulation is performed using the design to create a set of current simulation results associated with the design (operation 404). For example, the user may run an HSPICE simulation on the design to generate signal values representing the operation of the integrated circuit. The user may then use the signal values to verify the signal integrity of the integrated circuit.

The current design state of the design is automatically saved (operation 406) upon creating the current simulation results. In other words, a snapshot of the design may be made after the simulation of the design is conducted. The current simulation results may also be saved with the current design state (operation 408). For example, the current design state may be saved in a hidden directory within a directory containing the current simulation results.

Finally, subsequent access to the current design state and one or more previous design states is enabled through a GUI associated with the EDA application (operation 410). The GUI may display a simulation result history associated with the design to the user, display a graphic associated with changes to a parameter in the design over time, and/or enable a search of the simulation result history by the user. The simulation result history and the graphic may be associated with one or more sets of previous simulation results created using the design. For example, the simulation result history may correspond to a chronological list of all simulation results created from the design, while the graphic may contain a plot of parameter or output values in the simulation results over time. In addition, the previous simulation results may be saved with the previous design state(s) of the design. As a result, the user may access saved (e.g., current and previous) design states by selecting the corresponding simulation results within the GUI.

Figure 5:
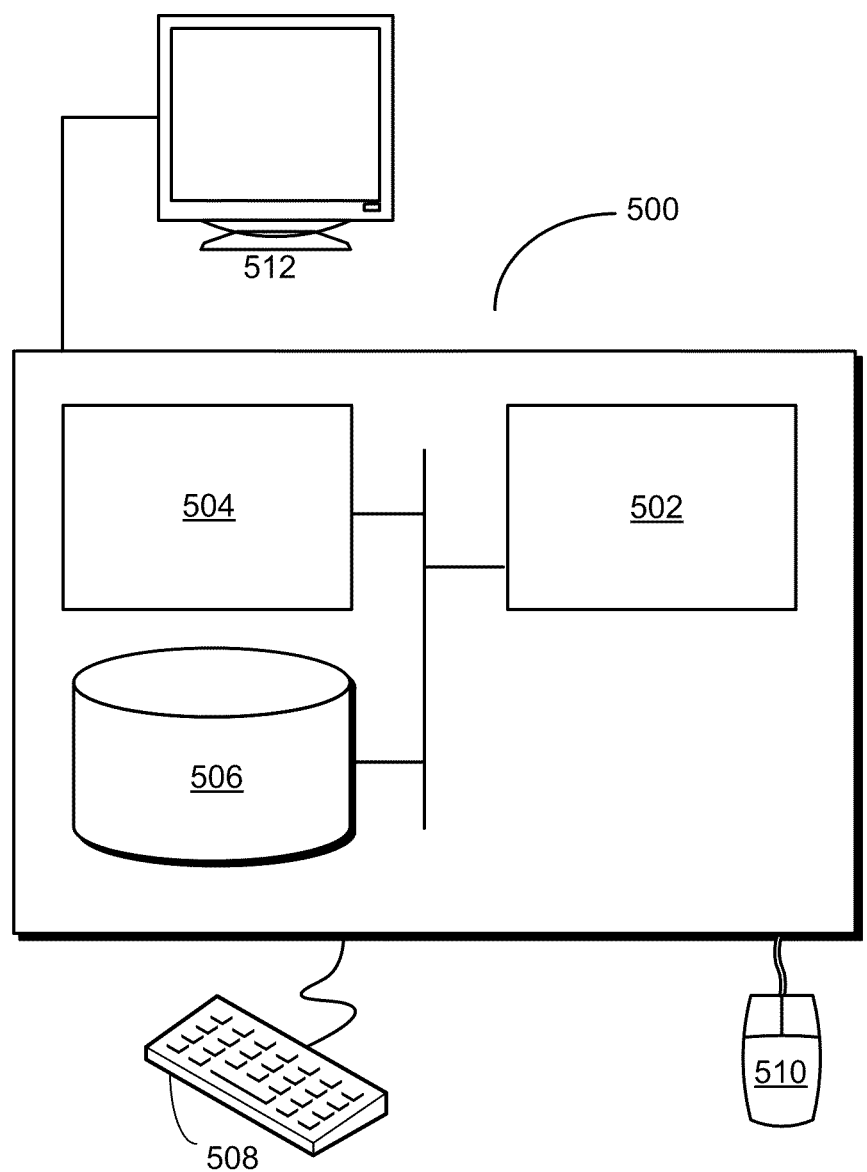
FIG. 5 shows a computer system in accordance with an embodiment of the present invention.

FIG. 5 shows a computer system 500 in accordance with an embodiment of the present invention. Computer system 500 includes a processor 502, memory 504, storage 506, and/or other components found in electronic computing devices. Processor 502 may support parallel processing and/or multi-threaded operation with other processors in computer system 500. Computer system 500 may also include input/output (I/O) devices such as a keyboard 508, a mouse 510, and a display 512.

Computer system 500 may include functionality to execute various components of the present embodiments. In particular, computer system 500 may include an operating system (not shown) that coordinates the use of hardware and software resources on computer system 500, as well as one or more applications that perform specialized tasks for the user. To perform tasks for the user, applications may obtain the use of hardware resources on computer system 500 from the operating system, as well as interact with the user through a hardware and/or software framework provided by the operating system.

In one or more embodiments, computer system 500 provides a system for performing a simulation within an EDA application. The system may include a simulation apparatus that performs the simulation using a design to create a set of current simulation results associated with the design. The system may also include a snapshot-generation apparatus that automatically saves a current design state of the design, which is associated with the current simulation results. Finally, the system may include a graphical user interface (GUI) that obtains the design from a user of the EDA application and enables subsequent access to the current design state and one or more previous design states of the design by the user.

In addition, one or more components of computer system 500 may be remotely located and connected to the other components over a network. Portions of the present embodiments (e.g., GUI, simulation apparatus, snapshot-generation apparatus, etc.) may also be located on different nodes of a distributed system that implements the embodiments. For example, the present embodiments may be implemented using a cloud computing system that allows simulations to be performed on a design using a remote EDA application.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A computer-implemented method for performing a simulation within an electronic design automation (EDA) application, comprising:
    simulating multiple versions of a circuit design to obtain multiple values of a parameter, wherein each value of the parameter corresponds to a version of the circuit design, and wherein the multiple versions of the circuit design are created as the circuit design is modified over time;
    associating the multiple versions of the circuit design with corresponding multiple values of the parameter;
    displaying a plot of the multiple values of the parameter versus time using a graphical user interface (GUI), wherein the plot illustrates an impact on the parameter as the circuit design is modified over time;
    receiving a selection of a value of the parameter using the GUI; and
    accessing a version of the circuit design that corresponds to the selected value of the parameter.

2. The computer-implemented method of claim 1, wherein the multiple circuit designs are saved in hidden directories within directories that contain simulation results corresponding to the multiple circuit designs.

3. The computer-implemented method of claim 1, further comprising:
    displaying a simulation result history associated with the multiple versions of the circuit design; and
    enabling a search of the simulation result history.

4. The computer-implemented method of claim 1, wherein the design corresponds to an analog circuit design.

5. The computer-implemented method of claim 1, wherein the circuit design is modified over time by performing one or more of the following operations:
    adding or deleting one or more components,
    modifying an arrangement of components, or
    modifying interconnections between components.

6. The computer-implemented method of claim 1, wherein the parameter is an analog parameter.

7. The computer-implemented method of claim 6, wherein the analog parameter is power consumption.

8. A system for performing a simulation within an electronic design automation (EDA) application, comprising:
    a processor; and
    a non-transitory storage medium storing instructions that, when executed by the processor, cause the system to perform a method comprising:
        simulating multiple versions of a circuit design to obtain multiple values of a parameter, wherein each value of the parameter corresponds to a version of the circuit design, and wherein the multiple versions of the circuit design are created as the circuit design is modified over time;
        associating the multiple versions of the circuit design with corresponding multiple values of the parameter;
        displaying a plot of the multiple values of the parameter versus time using a graphical user interface (GUI), wherein the plot illustrates an impact on the parameter as the circuit design is modified over time;
        receiving a selection of a value of the parameter using the GUI; and
        accessing a version of the circuit design that corresponds to the selected value of the parameter.

9. The system of claim 8, wherein the multiple circuit designs are saved in hidden directories within directories that contain simulation results corresponding to the multiple circuit designs.

10. The system of claim 8, wherein the method further comprises:
    displaying a simulation result history associated with the multiple versions of the circuit design; and
    enabling a search of the simulation result history by the user.

11. The system of claim 8, wherein the design corresponds to an analog circuit design.

12. The system of claim 8, wherein the circuit design is modified over time by performing one or more of the following operations:
    adding or deleting one or more components,
    modifying an arrangement of components, or
    modifying interconnections between components.

13. The system of claim 8, wherein the parameter is an analog parameter.

14. The system of claim 13, wherein the analog parameter is power consumption.

15. A non-transitory computer-readable storage medium storing instructions that when executed by a computer cause the computer to perform a method for performing a simulation within an electronic design automation (EDA) application, the method comprising:
    simulating multiple versions of a circuit design to obtain multiple values of a parameter, wherein each value of the parameter corresponds to a version of the circuit design, and wherein the multiple versions of the circuit design are created as the circuit design is modified over time;
    associating the multiple versions of the circuit design with corresponding multiple values of the parameter;
    displaying a plot of the multiple values of the parameter versus time using a graphical user interface (GUI), wherein the plot illustrates an impact on the parameter as the circuit design is modified over time;
    receiving a selection of a value of the parameter using the GUI; and
    accessing a version of the circuit design that corresponds to the selected value of the parameter.

16. The non-transitory computer-readable storage medium of claim 15, wherein the multiple circuit designs are saved in hidden directories within directories that contain simulation results corresponding to the multiple circuit designs.

17. The non-transitory computer-readable storage medium of claim 15, wherein of the method further comprises:
    displaying a simulation result history associated with the multiple versions of the circuit design; and
    enabling a search of the simulation result history.

18. The non-transitory computer-readable storage medium of claim 15, wherein the design corresponds to an analog circuit design.

19. The non-transitory computer-readable storage medium of claim 15, wherein the circuit design is modified over time by performing one or more of the following operations:
    adding or deleting one or more components,
    modifying an arrangement of components, or
    modifying interconnections between components.

20. The non-transitory computer-readable storage medium of claim 15, wherein the parameter is an analog parameter.

21. The non-transitory computer-readable storage medium of claim 20, wherein the analog parameter is power consumption.

22. A graphical user interface (GUI) for facilitating the creation of a design within an electronic design automation (EDA) application, comprising:
- a display mechanism that displays how a parameter varies over time to illustrate an impact on the parameter as a circuit design is modified, wherein multiple versions of a circuit design are simulated to obtain multiple values of the parameter, and wherein the multiple versions of the circuit design are created as the circuit design is modified over time;
- a receiving mechanism that receives a selection of a value of the parameter;
- a graphic mechanism that accesses a version of the circuit design that corresponds to the selected value of the parameter;
- a history mechanism that displays a simulation result history associated with the multiple versions of the circuit design; and
- a search mechanism that enables a search of the simulation result history.

* * * * *